United States Patent [19]
Hirano

[11] Patent Number: 5,489,372
[45] Date of Patent: Feb. 6, 1996

[54] PROCESS FOR PRODUCING LIGHT ABSORPTION LAYER OF SOLAR CELL

[75] Inventor: Tomio Hirano, Susono, Japan

[73] Assignee: Fujitsu Limited, Tokyo, Japan

[21] Appl. No.: 302,976

[22] Filed: Sep. 12, 1994

[30] Foreign Application Priority Data

Sep. 16, 1993 [JP] Japan .................... 5-230011

[51] Int. Cl.⁶ .......................... C25D 15/00; H01L 31/18
[52] U.S. Cl. .................. 205/109; 205/170; 205/182;
205/224; 205/225; 205/227; 205/228; 427/76;
437/5; 136/264; 136/265
[58] Field of Search ........................... 205/109, 170,
205/182, 224–225, 227–228; 437/5; 427/76;
136/264, 265

[56] References Cited

U.S. PATENT DOCUMENTS 5,275,714 1/1994 Bonnet et al. ................. 205/109

FOREIGN PATENT DOCUMENTS

WO92/05586 4/1992 WIPO .
WO94/29904 12/1994 WIPO .................... 205/109

*Primary Examiner*—Aaron Weisstuch
*Attorney, Agent, or Firm*—Armstrong, Westerman Hattori, McLeland & Naughton

[57] ABSTRACT

A process for producing a light absorption layer of a solar cell is disclosed, in which prior to heat-treatment, at least two of the following steps are performed in combination: (1) electrodeposition of a copper layer including selenium particles, (2) electrodeposition of an indium layer including selenium particles, (3) electrodeposition of a copper layer not including selenium, and (4) electrodeposition of an indium layer not including selenium. Control of copper, indium, and selenium contents becomes easier with this process.

9 Claims, No Drawings

5,489,372

PROCESS FOR PRODUCING LIGHT ABSORPTION LAYER OF SOLAR CELL

BACKGROUND OF THE INVENTION

1) Field of the Invention

The present invention relates to a process for producing a light absorption layer of a solar cell which layer consists of a compound semiconductor of Group IB, Group 3A, and Group 6A of the periodic table. More specifically, the present invention relates to a process for producing a light absorption layer of a solar cell which layer consists of a ternary alloy comprising copper-indium-selenium.

2) Description of the Prior Art

A solar cell is a device to convert light energy into electrical energy and is normally composed of a light-transmitting electrode, a light absorption layer consisting of a photoelectric semiconductor, and an electrode laminated sequentially on an insulating substrate. As for the photoelectric semiconductor, it has been considered that the highest efficiency for photoelectric conversion is given by a thin layer of ternary alloy of copper-indium-selenium, the atomic ratios of which are 1:1:2. However, it has been difficult to control the thickness of the thin layer of the alloy while controlling the ratios of the three components.

That is, in the production of the light absorption layer by vapor deposition which has been widely employed for the formation of thin layers, it has been very difficult to control exactly the ratios of copper, indium, and selenium. In a process for alloying the vapor deposited layer after each component has been deposited, it has also been difficult to attain a uniform alloy. In addition, such alloying method tends to cause fluctuation of the composition in a heat treatment step and also has a problem of high production cost for forming a light absorption layer having a large area. Further, although thin films of copper, indium, or alloys thereof can be formed by electrolytic plating at a relatively low cost, electrodeposition of selenium is not easy.

Recently, a process for producing a light absorption layer of ternary alloy of copper-indium-selenium has been proposed, in which a copper-indium layer with dispersed selenium particles is formed by using an alloy electrodeposition bath of copper and indium, in which a dispersion of fine selenium particles is suspended, and the thus formed deposition layer is alloyed in such a manner as disclosed in PCT Publication No. WO 92/05586. However, according to this process, it is required to balance the conditions in the electrodeposition bath, such as pH, temperature, concentration of metal ions, current density, stirring speed, and the like in order to control the composition of the electrodeposited layer. Such control is relatively easy if the constituents are copper and indium; however, there is difficulty in controlling the amount of selenium particles contained in the deposit. Accordingly, it has been very difficult to produce the light absorption layer of the solar cell in a stable manner with good performance.

It is therefore an object of the present invention to eliminate the problems encountered with the prior art method and to provide an improved process for producing in a stable manner a light absorption layer of a solar cell which comprises a ternary alloy of copper-indium-selenium having an atomic ratio controlled to be in a desired narrow range.

SUMMARY OF THE INVENTION

According to the present invention, a light absorption layer of a solar cell is provided having a preferred atomic composition and thickness and excellent crystallinity. The present invention for obtaining such light absorption layer comprises a combination of steps selected from a series of steps of forming an electrodeposited copper layer which contains dispersed selenium particles by employing a copper plating bath with a dispersion of fine particles of selenium suspended therein, forming an electrodeposited indium layer which contains dispersed selenium particles by employing an indium plating bath with a dispersion of fine particles of selenium suspended therein, forming an electrodeposited copper layer by employing a copper plating bath, and forming an electrodeposited indium layer by employing an indium plating bath. By properly selecting a combination of the enumerated steps, an electrodeposited layer consisting of a plurality of plated layers comprising three constituents, i.e., copper, indium, and selenium is formed on a conductive substrate. The thus formed electrodeposited layer is then converted into a ternary alloy layer of copper-indium-selenium by a heat-treatment.

DETAILED DESCRIPTION OF THE INVENTION

In one aspect of the present invention for producing a light absorption layer of a solar cell, a multi-layer type electrodeposited layer comprising three constituents, i.e. copper, indium, and selenium is formed on a conductive substrate by implementing, in combination, at least two electrodeposition steps: (1) forming an electrodeposited copper layer which contains dispersed selenium particles by employing a copper plating bath with a dispersion of fine particles of selenium suspended therein, and (2) forming an electrodeposited indium layer which contains dispersed selenium particles by employing an indium plating bath with a dispersion of fine particles of selenium suspended therein. The thus formed electrodeposited layer is then converted into a ternary alloy layer of copper-indium-selenium by a heat-treatment.

In another aspect of this invention for producing a light absorption layer of a solar cell, a multi-layer type electrodeposited layer comprising three constituents, i.e. copper, indium, and selenium is formed on a conductive substrate by implementing, in combination, at least two electrodeposition steps: (1) forming an electrodeposited copper layer which contains dispersed selenium particles by employing a copper plating bath with a dispersion of fine particles of selenium suspended therein, and (2) forming an electrodeposited indium layer by employing an indium plating bath. The thus formed electrodeposition layer is then converted into a ternary alloy layer of copper-indium-selenium by a heat-treatment.

In still another aspect of this invention for producing a light absorption layer of a solar cell, a multi-layer type electrodeposited layer comprising three constituents, i.e. copper, indium, and selenium is formed on a conductive substrate by implementing, in combination, at least two steps: (1) forming an electrodeposited copper layer by employing a copper plating bath, and (2) forming an electrodeposited indium layer which contains dispersed selenium particles by employing an indium plating bath with a dispersion of fine particles of selenium suspended therein. The thus formed electrodeposition layer is then converted into a ternary alloy layer of copper-indium-selenium by a heat-treatment.

As mentioned above, while it is very difficult to control the composition of the layer to be within a desired range when electrodepositing the three constituents at the same time, however, it is relatively easy to control two constituents of the layer, such as in copper plating with dispersed selenium particles and indium plating with dispersed selenium particles. According to the present invention, it is possible to control the ratios of the constituents of the composition to be within a desired range by depositing each layer in succession and adjusting the thickness of each by selecting from a combination of a copper layer with dispersed selenium particles, an indium layer with dispersed selenium particles, a copper layer not containing selenium, and an indium layer not containing selenium.

The present invention will be illustrated in more detail by the EXAMPLES taken in view of the Reference Examples which follow below.

Reference Example 1

An electrodeposited copper layer having a thickness of 1 μm was formed by conducting the electrodeposition thereof for five (5) minutes at a current density of 1 A/dm$^2$ using a sulfuric acid type electrodeposition bath which contained 0.8 mol/l of cupric sulfate, wherein a glass substrate having a molybdenum thin film electrode on the surface thereof was employed as the cathode.

Reference Example 2

An electrodeposited indium layer having a thickness of 1 μm was formed by conducting the electrodeposition thereof for three (3) minutes at a current density of 1 A/dm$^2$ using a sulfuric acid type electrodeposition bath which contained 0.1 mol/l of indium sulfate, wherein a glass substrate having the same molybdenum thin film electrode as in Reference example 1 was utilized as the cathode.

Reference Example 3

An electrodeposited copper layer continuing selenium particles and having a thickness of 6.0 μm was formed by conducting the electrodeposition thereof for six (6) minutes with stirring at a current density of 5 A/dm$^2$, using a sulfamic acid type electrodeposition bath which contained 0.5 mol/l of cupric ion and mixed with fine selenium powder of 30 g/l, wherein a glass substrate having the same molybdenum thin film electrode as in Reference example 1 was utilized as the cathode. The thus obtained electrodeposited copper layer was analyzed and it was found that 32.1 mol % copper and 67.9 mol % selenium were contained therein.

Reference Example 4

An electrodeposited indium layer containing selenium particles and having a thickness of 3.3. μm was formed by conducting the electrodeposition thereof for five (5) minutes with stirring at a current density of 2 A/dm$^2$ in a sulfuric acid type electrodeposition bath which contained 1.0 mol/l of indium and mixed with fine selenium powder for 20 g/l, wherein a glass substrate having the same molybdenum thin film electrode as in Reference example 1 was utilized as the cathode. The thus obtained electrodeposited indium layer was analyzed and it was found that 65.0 mol % indium and 35.0 mol % selenium were contained therein.

EXAMPLE I

A laminated layer having a molar ratio of 1:1:2.6 for copper: indium: selenium was formed by electrodepositing an indium layer containing selenium particles and having a thickness of 3.3 μm, under the same conditions as in Reference Example 4, on an electrodeposited copper layer containing selenium particles and having a thickness of 6.0 μm and formed under the same conditions as in Reference Example 3. Then, this laminated layer was inserted into a vacuum furnace for heat treatment together with a boat filled with selenium powder. The heat-treatment was implemented at 200° C. for 1 hour and then at 400° C. for 2 hours after evacuating the atmosphere therein to a 10$^{-3}$ Torr. A p-type light absorption layer for a solar cell having excellent crystallinity and a molar ratio of 1:1:2 for the copper: indium: selenium was obtained.

EXAMPLE II

A laminated layer having a molar ratio of 1:1:2.1 for copper: indium: selenium was formed by electrodepositing an indium layer not containing selenium and having a thickness of 2.2 μm, under the same conditions as in Reference Example 2, on an electrodeposited copper layer containing selenium particles and having a thickness of 6.0 μm and formed under the same conditions as in Reference Example 3. Then, this lamination layer was heat-treated under the same conditions as in EXAMPLE 1. A p-type light absorption layer for a solar cell having excellent crystallinity and a molar ratio of 1:1:2 for the copper: indium: selenium was obtained.

EXAMPLE III

A laminated layer having a molar ratio of 2:2:1 for copper: indium: selenium was formed by electrodepositing an indium layer containing selenium particles and having a thickness of 3.3 μm, under the same conditions as in Reference Example 4, on an electrodeposited copper layer having a thickness of 1.0 μm and formed under the same condition as in Reference Example 1. Then, this lamination layer was heat-treated under the same conditions as in EXAMPLE I. A p-type light absorption layer for a solar cell having excellent crystallinity and a molar ratio of 1:1:2 for the copper: indium: selenium was obtained.

It is to be understood by those skilled in the art that the foregoing description relates only to preferred embodiments of the present invention and various changes and modifications may be made in the invention without departing from the spirit and scope thereof.

What is claimed is:

1. A process for producing a light absorption layer for a solar cell, comprising the steps of:

implementing at least two steps, in combination, of forming on a conductive substrate (1) an electrodeposited copper layer which contains dispersed selenium particles by use of a copper plating bath with a dispersion of fine particles of selenium suspended therein and (2) forming an electrodeposited indium layer thereon which contains dispersed selenium particles by use of an indium plating bath with a dispersion of fine particles of selenium suspended therein to form a multi-layer electrodeposited layer including copper, indium, and selenium on said conductive substrate; and heat-treating the multi-layer electrodeposited layer to convert it into a ternary alloy layer of copper-indium-selenium.

2. The process according to claim 1, wherein said copper plating bath is a sulfamic acid type electrodeposition bath which contains cupric ions and is mixed with fine selenium powder.

3. The process according to claim 1, wherein said indium plating bath is a sulfuric acid type electrodeposition bath which contains indium and is mixed with fine selenium powder.

4. A process for producing a light absorption layer for a solar cell, comprising the steps of:

implementing at least two steps, in combination, of forming on a conductive substrate (1) an electrodeposited copper layer which contains dispersed selenium particles by use of a copper plating bath with a dispersion of fine particles of selenium suspended therein and (2) forming an electrodeposited indium layer thereon by use of an indium plating bath to form a multi-layer electrodeposited layer including copper, indium, and selenium on said conductive substrate; and heat-treating the multi-layer electrodeposited layer to convert it into a ternary alloy layer of copper-indium-selenium.

5. The process according to claim 4, wherein said copper plating bath is a sulfamic acid type electrodeposition bath which contains cupric ions and is mixed with fine selenium powder.

6. The process according to claim 4, wherein said indium plating bath is sulfuric acid type electrodeposition bath which contains indium sulfate.

7. A process for producing a light absorption layer for a solar cell, comprising the steps of:

implementing at least two steps, in combination, of forming on a conductive substrate (1) an electrodeposited copper layer by use of a copper plating bath and (2) forming an electrodeposited indium layer thereon which contains dispersed selenium particles by use of an indium plating bath with a dispersion of fine particles of selenium suspended therein to form a multi-layer electrodeposited layer including copper, indium, and selenium on said conductive substrate; and heat-treating the multi-layer type electrodeposition layer to convert it into a ternary alloy layer of copper-indium-selenium.

8. The process according to claim 7, wherein said copper plating bath is a sulfuric acid type electrodeposition bath which contains cupric sulfate.

9. The process according to claim 7, wherein said indium plating bath is a sulfuric acid type electrodeposition bath which contains indium and is mixed with fine selenium powder.

* * * * *

UNITED STATES PATENT AND TRADEMARK OFFICE
CERTIFICATE OF CORRECTION

PATENT NO. : 5,489,372
DATED : February 6, 1996
INVENTOR(S) : Tomio Hirano

It is certified that error appears in the above-indentified patent and that said Letters Patent is hereby corrected as shown below:

On the title page: Item [73]
please delete "Fujitsu Limited, Tokyo, Japan" and insert therefor --Yazaki Corporation, Tokyo, Japan--.

Signed and Sealed this

Twenty-ninth Day of April, 1997

Attest:

BRUCE LEHMAN

*Attesting Officer*   *Commissioner of Patents and Trademarks*